US005274296A

United States Patent [19]
Hiki et al.

[11] Patent Number: 5,274,296
[45] Date of Patent: Dec. 28, 1993

[54] ULTRASONIC PROBE DEVICE

[75] Inventors: Susumu Hiki, Octawara; Yoshitaka Mine, Nishinasunomachi, both of Japan

[73] Assignee: Kabushiki Kaisha Toshiba, Kawasaki, Japan

[21] Appl. No.: 729,845

[22] Filed: Jul. 12, 1991

Related U.S. Application Data

[63] Continuation of Ser. No. 427,905, Oct. 23, 1989, abandoned, which is a continuation of Ser. No. 294,123, Jan. 6, 1989, abandoned.

[30] Foreign Application Priority Data

Jan. 13, 1988 [JP] Japan .................................. 63-3825

[51] Int. Cl.$^5$ .............................................. H01L 41/08
[52] U.S. Cl. ........................................ 310/327; 73/632
[58] Field of Search ................... 310/327, 326, 313 D; 73/606, 626, 627, 632

[56] References Cited

U.S. PATENT DOCUMENTS

| | | | |
|---|---|---|---|
| 4,510,410 | 4/1985 | Yuhara et al. | 310/313 D |
| 4,528,652 | 7/1985 | Horner et al. | 310/327 |
| 4,571,520 | 2/1986 | Saito et al. | 310/327 |
| 4,728,844 | 3/1988 | Wilson et al. | 310/327 |
| 4,800,316 | 1/1989 | Ju-Zhen | 310/327 |

OTHER PUBLICATIONS

Ultrasonic Properties of Transducer Backings, C. M. Sayers et al., Ultrasonics, Mar. 1984.

*Primary Examiner*—Louis Arana
*Attorney, Agent, or Firm*—Cushman, Darby & Cushman

[57] ABSTRACT

An ultrasonic probe device has an ultrasonic transducer unit including a plurality of ultrasonic transducer elements electrically isolated from one another. A backing member for mechanically damping the ultrasonic transducer unit is arranged on the ultrasonic transducer unit. A plurality of signal lines is connected to the transducer elements, respectively, and extends on the backing member. The backing member is molded from a composition containing rubber material and a metal oxide which is unreducible by the heat applied during a molding process of the backing member.

7 Claims, 1 Drawing Sheet

ULTRASONIC PROBE DEVICE

This is a continuation of application No. 07/427,905, filed on Oct. 23, 1989, which was abandoned upon the filing hereof which is a continuation of 07/294,123 filed Jan. 6, 1989, now abandoned.

BACKGROUND OF THE INVENTION

1. Field of the Invention

The present invention relates to an ultrasonic probe device having a plurality of signal lines, and more particularly to an ultrasonic probe device wherein the crosstalk among the signal lines is reduced.

2. Description of the Related Art

An ultrasonic probe device is used to form a tomogram of, for example, a human organ, which will help to diagnose human diseases. Various types of ultrasonic probe devices are known. One of them comprises a transducer unit having a plurality of transducer elements arranged in an array. An acoustic lens is located in front of the transducer unit, and an acoustic matching layer is interposed between the transducer unit and the acoustic lens. A backing member is arranged on the back of the transducer unit. Signal lines extend on the backing member, each connected to one transducer element.

The transducer elements are arranged close to one another to improve the directivity of ultrasonic waves. Thus the signal lines are also placed close to one another, and prominent crosstalk will likely be observed among the lines (or channels). To reduce the crosstalk, a variety of design schemes have been proposed, only to obtain unsatisfactory results.

SUMMARY OF THE INVENTION

The present invention is directed to an improvement in the material of the backing member of an ultrasonic probe device, thereby minimizing the crosstalk among the signal lines of the probe device.

Accordingly, it is an object of the present invention to provide an ultrasonic probe device which has a backing member made of such material as reduces the crosstalk among the signal lines of the probe device.

According to the present invention, there is provided an ultrasonic probe device comprising:

an ultrasonic transducer unit including a plurality of ultrasonic transducer elements electrically isolated from one another;

a backing member arranged on the ultrasonic transducer unit, for mechanically damping the ultrasonic transducer unit, said backing member being molded from a composition containing rubber material and a metal oxide which is unreducible by the heat applied during a molding process of the backing member; and a plurality of signal lines connected to the transducer elements, respectively, and extending on the backing member.

DETAILED DESCRIPTION OF THE PREFERRED EMBODIMENTS

The inventors hereof studied and researched profoundly in order to develop an ultrasonic transducer device in which the crosstalk among the signal lines of the probe device is reduced as mush as possible. Their attention was focussed on the material of the backing member of the device.

The function of the backing member incorporated in an ultrasonic probe device is to mechanically damp ultrasonic waves to a sufficient degree. Naturally it is required to possess adequate mechanical strength and sufficient acoustic attenuation. To have both properties, the conventional backing member is made of a rubber-based composition formed of rubber material, such as chloroprene rubber, and ferrite powder, among other things, thoroughly mixed with the rubber. The ferrite powder has a grain size of 3 $\mu$m or less.

Figure 1:
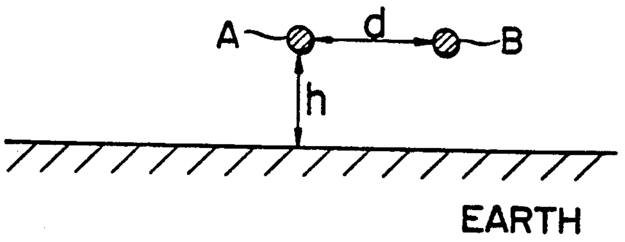
FIG. 1 is a diagram illustrating the mutual inductance of two parallel wires per unit length.

Referring to FIG. 1, assume that two parallel wires A and B are arranged in a horizontal plane located at a distance h from the earth, and spaced apart by distance d. When a current I flows through both wires A and B in the same direction, the mutual inductance M for the unit length of the parallel wires is given:

$$M = \frac{\mu}{4\pi} \log_e \frac{d^2 + (2h)^2}{d^2} \; [H/m]$$

where $\mu$ is the magnetic permeability of the medium of the system.

The amount of the crosstalk generated between the wires A and B is regarded as being proportionate to the mutual inductance M. Hence, the above equation shows that the backing member of an ultrasonic probe device, which is equivalent to the medium, must have as small a specific permeability as is possible in order to minimize the crosstalk between wires A and B. (The ideal specific permeability is, of course, 1.) In addition, the greater the specific dielectric constant of the backing member, the larger the electrostatic capacitance thereof. The great electrostatic capacitance of the backing member inevitably results in a noticeable coupling between the wires A and B. Due to this coupling, crosstalk occurs between the parallel wires A and B. Obviously, it is necessary to use a material for the backing member, which has not only a small specific permeability, but also a sufficiently small specific dielectric constant.

The determinant of both the specific permeability and the specific dielectric constant of the backing member is nothing but the dielectric material which the backing member contains. The dielectric material, ferrite, contained in the conventional backing member, must originally have a relatively small permeability and also a relatively small dielectric constant. Nonetheless, it has been ascertained that the prior art backing member made of the composition consisting of rubber and ferrite powder does not reduce the crosstalk among the signal lines, as much as is expected.

To determine see why so, the inventors analyzed and studied the conventional backing member used in the prior art ultrasonic probe device. They found that the ferrite has been reduced due to the heat applied during the molding of the backing member, and both its relative permeability and its specific dielectric constant increase eventually. More specifically, it was found that since a relatively high temperature (e.g., about 200° C.) is applied during manufacture of the backing member to melt the rubber, thus dispersing the ferrite powder uniformly in the rubber, at least part of the ferrite powder is reduced with the high temperature to have its permeability and dielectric constant increased to 6 to 7 and 40, respectively. This is why the crosstalk inevitably took place among the signal lines of the conventional ultrasonic probe device.

Accordingly, the present invention uses a backing member containing a metal oxide which is not reduced (that is, retains its original oxidized state) despite the high temperature at which the backing member is formed. Preferable as such metal oxide are: α-alumina, titanium oxide, and tungsten oxide, among other things. A mixture of two or more of these oxides can be used as well. Of these metal oxides, α-alumina is the most desirable. Preferably, the metal oxide is used in the form of powder whose grain size is 3 μm or less.

Preferable as the rubber component of the backing member incorporated in the ultrasonic probe device according to the invention are: chloroprene rubber, natural rubber, butyl rubber, and the like. A mixture of two or more of these rubbers can also be used. Of these rubbers, chloroprene rubber is the most desirable.

The mixing ratio of the metal oxide to the rubber material is determined by the desired acoustic impedance of the backing member. The acoustic impedance increases with the increase in the content of the metal oxide. Generally, it is desirable that the acoustic impedance of the backing member be about $2\times10^6$ to $6\times10^6$ $kg/m^2$ sec. in order for the probe device to have an adequate sensitivity and a sufficient distance resolution. The metal oxide and the rubber material should preferably be mixed in such an amount that the resultant backing member has the acoustic impedance values mentioned above. More specifically, the metal oxide and the rubber material can be used in the weight ratio of about 3:1.

To mold the backing member, the rubber material in the form of sheet is first wound about a roll. The wound rubber material is heated to 70° to 80° C. to lower its hardness (to soften).

A predetermined amount of the metal oxide is added to the softened rubber material. If necessary, a vulcanizing agent is added, and the mixture is kneaded. To uniformly mix the rubber material and the metal oxide, the temperature is increased to about 200° C. or more, and the mixing is continued at the increased temperature. During this mixing, the rubber material becomes free-flowable (liquid), thereby achieving the uniform mixing of the rubber-oxide mixture. This mixing is carried out, usually for 20 to 30 minutes.

The rubber-oxide mixture, at the increased temperature, is poured into a mold. A pressure ranging from 300 to 500 $kg/cm^2$ is applied on the mixture within the mold. Under this pressure, the mixture is cooled to room temperature. The resulting molding is removed from the mold, whereby a backing member is obtained.

The ferrite powder, which is used in forming the prior art backing member, is reduced when the rubber-ferrite mixture is heated to a prescribed temperature used, particularly, to uniformly mix the powder and the rubber material. In contrast to the ferrite powder, the metal oxide powder used in the present invention remains unreduced and retains its original small relative permeability and dielectric constant even if heated to such temperatures, thereby greatly contributing to the reduction of the crosstalk.

Figure 2:
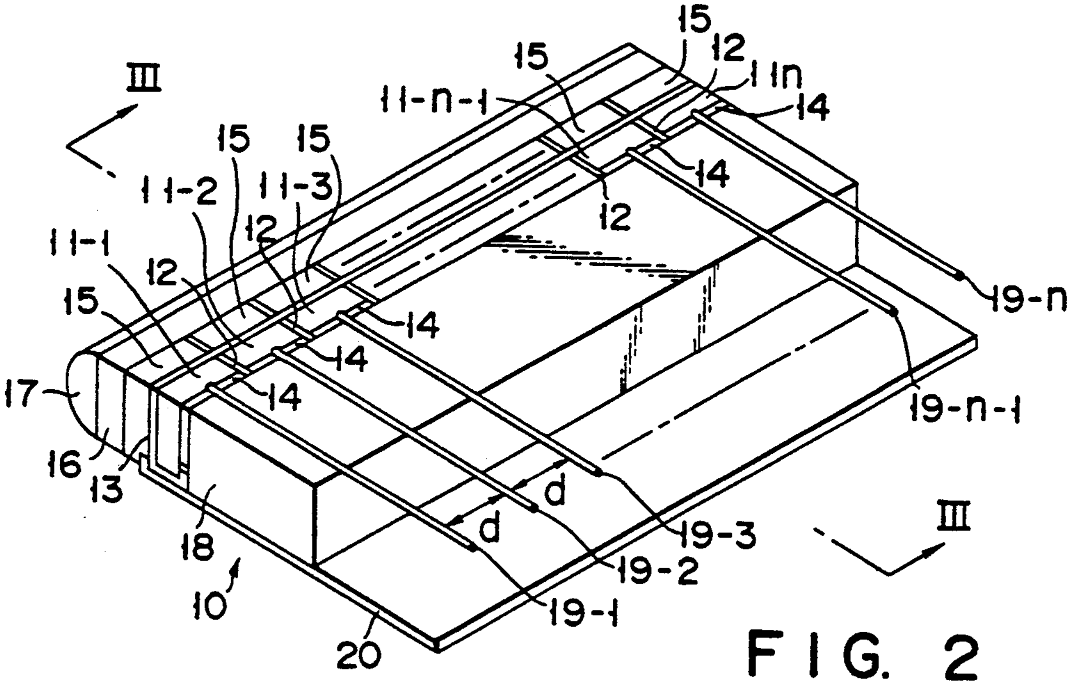
FIG. 2 is a perspective view showing an ultrasonic probe device according to one embodiment of the present invention.
Figure 3:
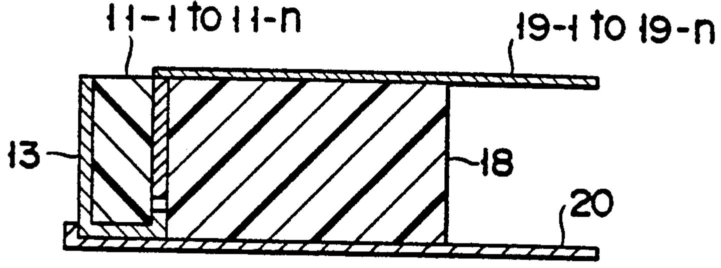
FIG. 3 is a cross-sectional view, taken along line III—III in FIG. 2, wherein the acoustic matching layer and the acoustic lens, both shown in FIG. 2, are not illustrated.

With reference to FIGS. 2 and 3, one embodiment of the invention, i.e., ultrasonic probe device 10 will now be described in detail.

As is shown in FIG. 2, ultrasonic probe device 10 comprises an array of ultrasonic transducer elements 11-l to 11-n. These elements are arranged in substantially the same plane, and constitute a transducer unit. They can be made of a piezoelectric ceramic material. Transducer elements 11-l to 11-n are electrically isolated from one another. For the electrical isolation, insulative members 12 are interposed between each adjacent transducer elements. Alternatively, air gaps can be provided among the transducer elements, thereby to isolate the elements electrically.

As is clearly illustrated in FIG. 3, each transducer element has a front electrode 13 and a rear electrode 13. Front electrode 13 is single plate-like, earth electrode which is common to all other transducer elements. Rear electrode 14 is a signal electrode separated from the signal electrodes of the other transducer elements. Earth electrode 13 covers also the lower surface of the transducer element.

A plurality of first acoustic matching layers 15 are formed on earth electrode 13, separated from one another, and provided for transducer elements 11-l to 11-n, respectively. A single plate-like second acoustic matching layer 16 is formed on first acoustic matching layers 15. First acoustic matching layers 15 and second acoustic matching layer 16 cooperate to match the acoustic impedance of the material of elements 11-l to 11-n with that of a living body, thereby improving transfer characteristics of the ultrasonic wave.

Convex acoustic lens 17 is adhered to the front of second acoustic matching layer 16. Acoustic lens 17 will contact the living body during the use of ultrasonic probe device 10.

Probe device 10 further comprises backing member 18. Backing member 18 of the invention is adhered to the back of the transducer unit, in contact with the signal electrodes 14 of transducer elements 11-l to 11-n. As has already been described, backing member 18 is molded from a composition containing the rubber material and the metal oxide powder mentioned above.

Signal lines 19-l to 19-n are connected to the signal electrodes 14 of transducer elements 11-l to 11-n, respectively. These lines are arranged on the upper surface of backing member 18, extend parallel to one another, and are spaced apart by a distance d of about 0.1 to 0.5 mm. Single plate-like earth conductor is connected to transducer elements 11-l to 11-n.

As is obvious to one skilled in the art, ultrasonic probe device 10 is connected to an ultrasonic-wave transmitter/receiver (not shown). The transmitter/ receiver supplies electrical signals to transducer elements 11-l to 11-n through signal lines 19-l to 19-n. Transducer elements 11-l to 11-n convert these signals into ultrasonic waves, and emit the waves into the living body. The ultrasonic waves are reflected from the organ within the living body. Transducer elements 11-l to 11-n receive these waves and convert them into electrical signals. These signals are supplied from elements 11-l to 11-n to the ultrasonic-wave transmitter/receiver through signal lines 19-l to 19-n. By so doing, the ultrasonic probe device serves to form a tomogram of the organ.

The backing member is fundamentally provided to perform mechanical damping of the transducer, thereby to broaden the frequency band of the ultrasonic probe device. In the present invention, the backing member 18 does contribute to reduction of the crosstalk among signal lines 19-l to 19-n, as well.

A backing member was molded through a molding process which involves kneading a mixture of α-alumina and chloroprene rubber, while heating the mixture to about 200° C. This backing member showed relative permeability of 1.1 and specific dielectric constant of 7.4. When the backing member is incorporated into an ultrasonic probe device, the crosstalk among signal lines 19-l to 19-n will be greatly reduced. Further, the inventors made a backing member by processing a mixture of α-alumina and chloroprene rubber in the weight ratio of 3:1, in the same way as described here. This backing member exhibited acoustic impedance of $4\times10^6$ to $6\times10^6$ kg/m$^2$sec. Thus, if this backing member is incorporated into an ultrasonic probe device, the device will have adequate sensitivity and sufficient distance resolution.

The present invention has been described with reference to a specific embodiment. However, the invention is not limited to this particular embodiment. Rather, it can be applied to any ultrasonic probe device that has a backing member and a plurality of signal lines extending on the backing member. For example, the present invention can be applied to an continuous-wave probe device for transmitting and receiving steerable continuous waves to collect Doppler information, in which the transducer elements 11-l to 11-n of the probe device 10 showing in FIG. 2 are divided into two groups, one for transmitting ultrasonic waves and the other for receiving ultrasonic waves. Further, the present invention can be applied to an ultrasonic probe device having a plurality of ring-shaped transducer elements arranged concentrically.

What is claimed is:

1. An ultrasonic probe device comprising:

an ultrasonic transducer unit including a plurality of ultrasonic transducer elements electrically isolated from one another;

a backing member arranged on said ultrasonic transducer unit, for mechanically damping said ultrasonic transducer unit, said backing member being molded from a composition containing rubber material and a metal oxide which is unreducible by the heat applied during a molding process of said backing member and which has a specific permeability of approximately 1 and a dielectric constant of approximately 7; and a plurality of signal lines connected to said transducer elements, respectively, and extending on said backing member.

2. The device according to claim 1, wherein said metal oxide retains its original oxidized state at a temperature of at least 200° C.

3. The device according to claim 1, wherein said metal oxide and said rubber material are contained in said backing member in such a weight ratio that the backing member has acoustic impedance ranging from about $2\times10^6$ to $6\times10^6$ kg/m$^2$sec.

4. The device according to claim 1, wherein said rubber material is selected from the group consisting of chloroprene rubber, natural rubber, butyl rubber, and a mixture of two or more of these rubbers.

5. The device according to claim 1, further comprising an earth conductor commonly connecting said transducer elements, and arranged on that surface of said backing member which is opposite to a surface on which said signal lines are arranged.

6. The device according to claim 1, further comprising an acoustic matching layer provided on the front of said transducer unit.

7. The device according to claim 6, further comprising an acoustic lens arranged on said acoustic matching layer.

* * * * *